(12) United States Patent
Toyomane et al.

(10) Patent No.: US 8,179,989 B2
(45) Date of Patent: May 15, 2012

(54) TRANSMISSION APPARATUS AND TRANSMISSION METHOD

(75) Inventors: Akira Toyomane, Kawasaki (JP); Katsunori Araki, Kawasaki (JP); Yoshihiro Gonai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 576 days.

(21) Appl. No.: 12/402,700

(22) Filed: Mar. 12, 2009

(65) Prior Publication Data
US 2009/0238294 A1 Sep. 24, 2009

(30) Foreign Application Priority Data
Mar. 21, 2008 (JP) .................................. 2008-74125

(51) Int. Cl.
*H04K 1/10* (2006.01)
(52) U.S. Cl. ........................................ 375/260; 375/297
(58) Field of Classification Search .......... 375/295–297, 375/284–285
See application file for complete search history.

(56) References Cited

U.S. PATENT DOCUMENTS

| | | | | |
|---|---|---|---|---|
| 7,542,517 B2 * | 6/2009 | Kroeger | ......................... | 375/296 |
| 2003/0156657 A1 * | 8/2003 | Schrader et al. | .............. | 375/295 |
| 2004/0233973 A1 * | 11/2004 | Fullerton et al. | .............. | 375/130 |
| 2005/0184803 A1 * | 8/2005 | Hirose et al. | .................. | 330/149 |
| 2005/0220172 A1 * | 10/2005 | Mo et al. | ........................ | 375/130 |
| 2006/0008028 A1 * | 1/2006 | Maltsev et al. | .............. | 375/297 |

FOREIGN PATENT DOCUMENTS

| JP | 2002-232328 | 8/2002 |
|---|---|---|
| JP | 2006-135417 | 5/2006 |

* cited by examiner

*Primary Examiner* — Emmanuel Bayard
(74) *Attorney, Agent, or Firm* — Myers Wolin, LLC

(57) ABSTRACT

An transmission apparatus includes a pseudo data addition section configured to add pseudo data into transmission data for a free subcarrier of a radio frequency, an OFDM modulator subjecting the transmission data added with the pseudo data to OFDM modulation, a power amplifier amplifying power of a transmission signal of the radio frequency, the transmission signal based on an OFDM signal subjected to the OFDM modulation, an antenna radiating the amplified transmission signal by using the radio frequency; and a distortion compensation circuit compensating for a distortion characteristic of the power amplifier by correcting the OFDM signal with a distortion compensation coefficient accumulated corresponding to the power value of the OFDM signal, outputting the corrected signal for the power amplifier, and monitoring the output of the power amplifier to update the distortion compensation coefficient.

11 Claims, 13 Drawing Sheets

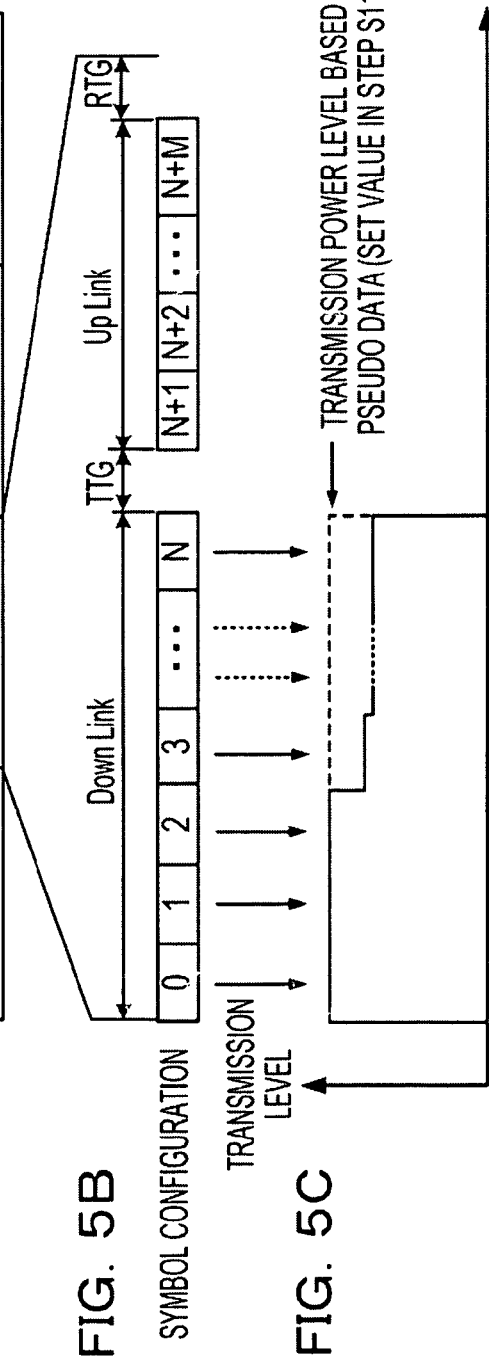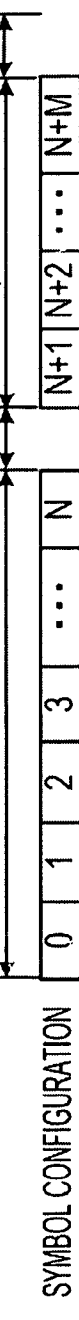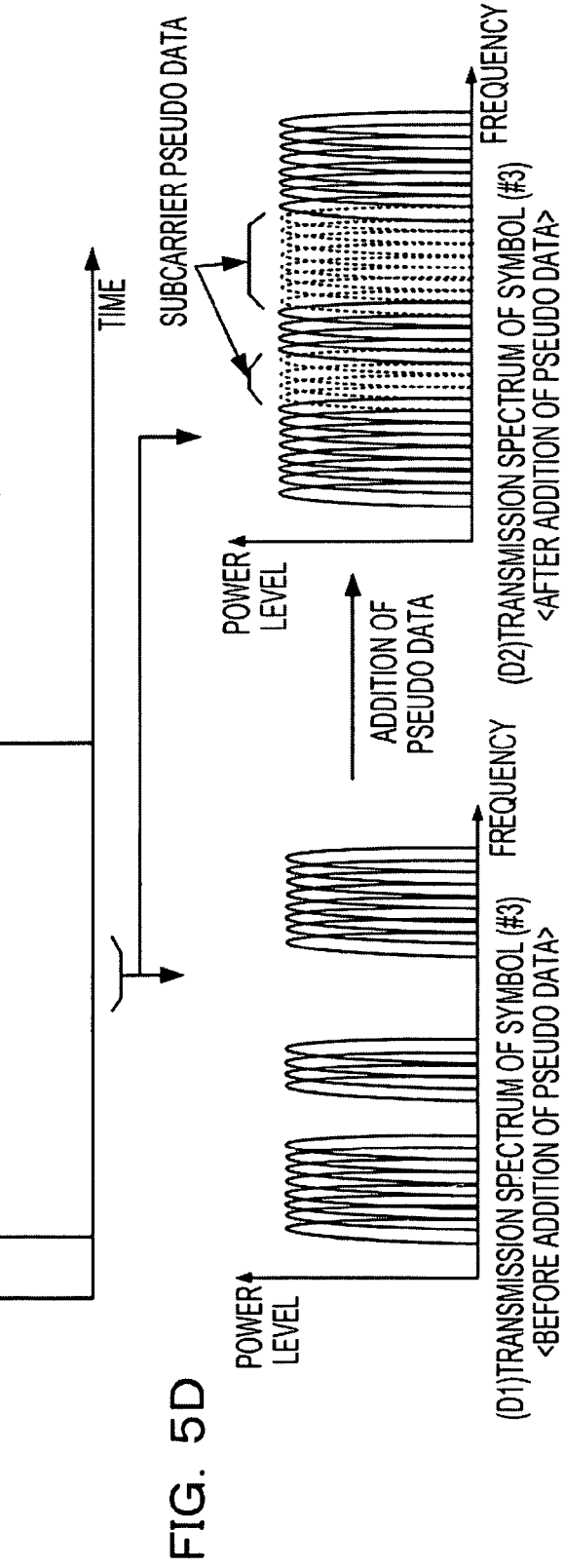

FIG. 8A FRAME CONFIGURATION

FIG. 8B SYMBOL CONFIGURATION

FIG. 8C TRANSMISSION POWER LEVEL

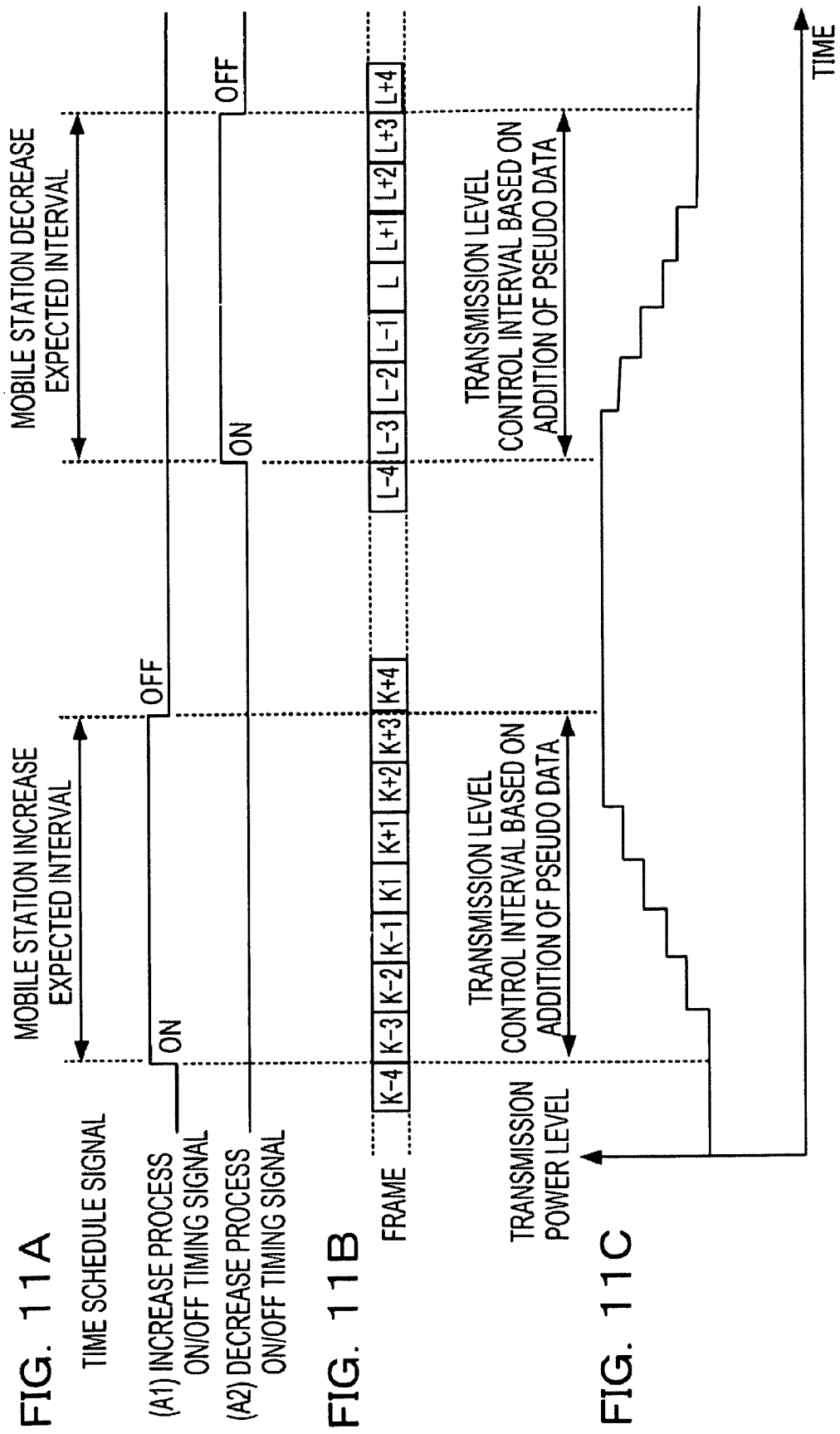

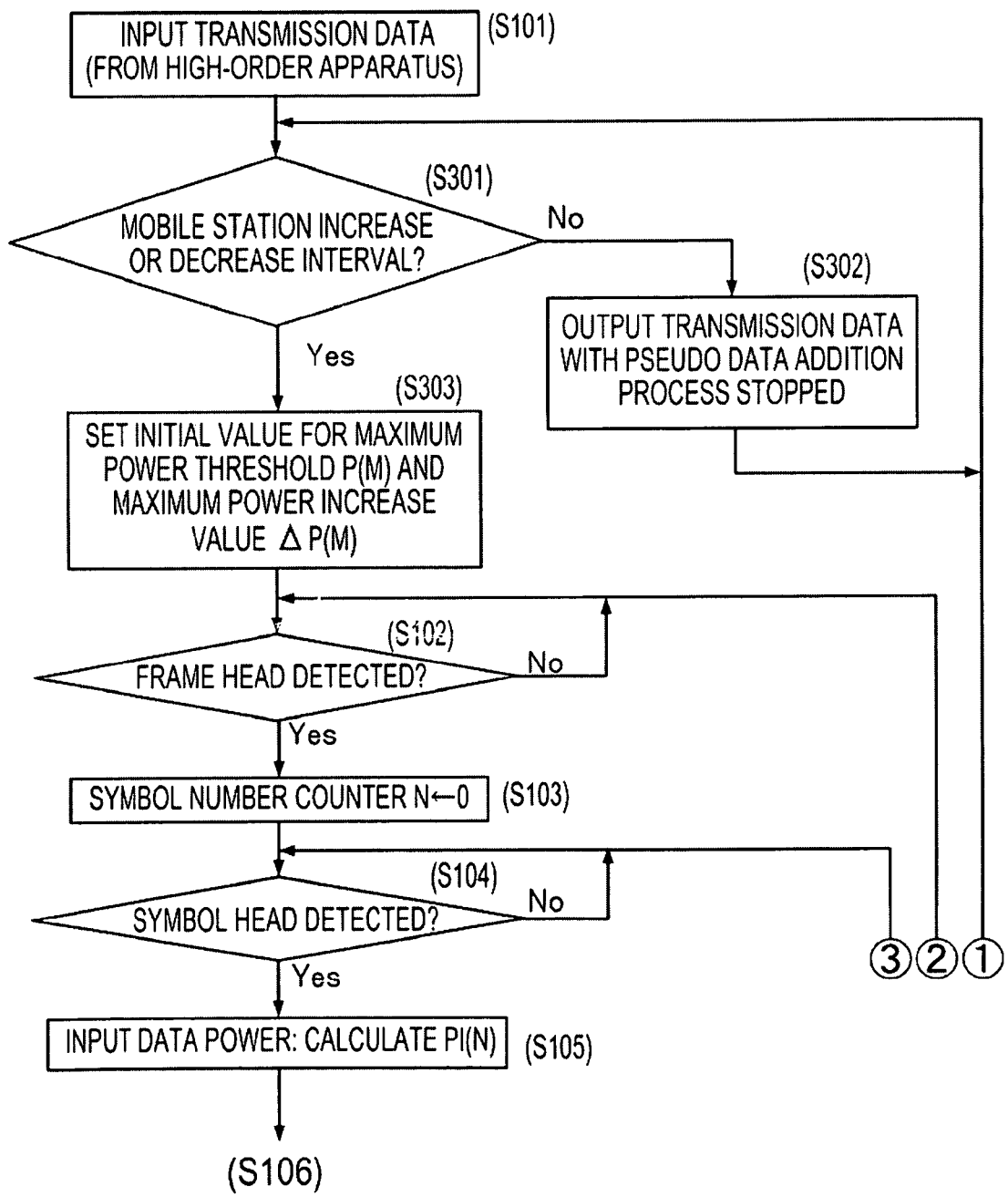

US 8,179,989 B2

TRANSMISSION APPARATUS AND TRANSMISSION METHOD

CROSS-REFERENCE TO RELATED APPLICATION

This application is based upon and claims the benefit of priority of the prior Japanese Patent Application No. 2008-74125, filed on Mar. 21, 2008, the entire contents of which are incorporated herein by reference.

FIELD

Embodiments of the present invention relate to a transmission apparatus and a transmission method in a radio communication network. The transmission apparatus and method include a technique used in, for example, an OFDM (Orthogonal Frequency Division Multiplexing) distortion-compensated and amplified transmission apparatus that performs transmissions using OFDM modulation signals.

BACKGROUND

Recently, an increased demand for radio communication has caused significant developments in radio communication systems.

FIG. 1 illustrates an entire radio communication network.

In FIG. 1, a plurality of mobile stations 10A and 10B and a plurality of base stations 20A, 20B, 20C, . . . are illustrated. The base stations 20A, 20B, 20C, . . . are intended for respective areas and each communicate wirelessly with the mobile station having moved into the area for which the base station is intended. The base stations 20A, 20B, 20C, . . . are connected to a network 40 via radio network control devices 30A, 30B, . . . which mediate communication between each of the base stations and the network 40. The mobile stations 10A and 10B placed in separate areas may also communicate with each other via the network 40. Here, the radio communication between each of the base stations 20A, 20B, 20C, . . . and each of the mobile stations 10A, 10B, . . . is based on an OFDM scheme. The description below relates to a distortion-compensated and amplified transmission apparatus configured as a transmission apparatus for each of the base stations 20A, 20B, 20C, . . .

FIG. 2 illustrates a conventional OFDM distortion-compensated and amplified transmission apparatus.

A distortion-compensated and amplified transmission apparatus 100A illustrated in FIG. 2 includes an OFDM modulation section 110, a distortion compensation circuit 120, a D/A converter 131, an orthogonal modulator 132, a power amplifier 133, a directional coupler 134, an antenna 135, an oscillator 136, an orthogonal demodulator 137, and an A/D converter 138.

The OFDM modulation section 110 subjects transmission data from a high-order apparatus to OFDM modulation. The OFDM modulation section 110 includes an S/P conversion section 111, a subcarrier modulation circuit 112, an IFFT section 113, a P/S conversion section 114, a G/I addition section 115, and a waveform shaping section 116. The S/P conversion section 111 subjects the transmission data from the high-order apparatus to serial-parallel conversion. The subcarrier modulation circuit 112 complexly modulates an output of the S/P conversion section 111 to generate a plurality of subcarrier signals. The IFFT section 113 subjects the subcarrier signals to fast reverse Fourier conversion so that a frequency axis is converted into a time axis. The P/S conversion section 114 subjects an output of the IFFT section 113 to parallel-serial conversion to output a signal based on the time axis and obtained by synthesizing signals of phase planes mapped to the subcarriers. The G/I addition section 115 inserts guard intervals (GIs) into the signal in order to mitigate inter-symbol interference in a multipath fading environment. The waveform shaping section 116 filters an output of the G/I addition section 115.

The distortion compensation circuit 120 performs distortion compensation based on a digital pre-distortion (DPD) scheme using an OFDM signal (reference signal) provided by the OFDM modulation section and a feedback signal for a transmission signal provided by the A/D converter 138. The distortion compensation circuit 120 includes an address generation section 121, a delay circuit 122, a subtractor 123, an LUT (Look Up Table) 124, and a complex multiplier 125. The address generation section 121 generates an address required to read a distortion compensation coefficient corresponding to a power value of the reference signal. The delay circuit 122 adjusts timing for the reference signal so that the reference signal and the feedback signal are compared with each other at the same timing. The subtractor 123 calculates an error component corresponding to a difference between the reference signal and feedback signal delayed by the delay circuit 122. The LUT 124 stores the distortion compensation coefficient adaptively updated so as to reduce the error component calculated by the subtractor 123. The complex multiplier 125 multiplies the reference signal by the appropriate distortion compensation coefficient read from the LUT 124 according to the address generated by the address generation section 121.

The D/A converter 131 converts a digital signal into an analog signal. The orthogonal modulator 132 receives a local oscillator signal from the oscillator 136 to orthogonally modulate and convert an I/Q signal output by the D/A converter 131 into a radio frequency.

The transmission signal converted into the radio frequency by the orthogonal modulator 132 is input to the power amplifier 133, which then amplifies the power of the signal. The transmission signal then passes through the directional coupler 134, which distributes and supplies the transmission signal to the antenna 135 and the orthogonal demodulator 137. The signal is then radiated to space through the antenna 135.

The feedback signal having returned from the directional coupler 134 to the orthogonal demodulator 137 is frequency-converted into a baseband signal and further demodulated into an I/Q signal by the orthogonal demodulator. The feedback signal is further converted, by the A/D converter 138, into an analog feedback signal, which is then input to the subtractor 123, making up the distortion compensation circuit 120.

Here, in the distortion-compensated and amplified transmission apparatus 100A, the power amplifier 133 causes nonlinear distortion. However, the distortion compensation circuit 120 pre-distorts a signal corresponding to the nonlinear distortion caused by the power amplifier 133 to cancel and compensate for the distortion caused by the power amplifier 133. In the distortion compensation circuit 120, the OFDM signal generated by the OFDM modulation section 110 is input to the complex multiplier 125 and to the address generation section 121 and the delay circuit 122. A distortion compensation coefficient corresponding to the power of an input OFDM signal is accumulated in the LUT 124 in order to compensate for the distortion characteristic of the power amplifier 133. In the distortion compensation circuit 120, the address generation section 121 obtains an address corresponding to the power value of the OFDM signal to output the distortion compensation coefficient corresponding to the address obtained, to the complex multiplier 125. That is, the OFDM signal input to the complex multiplier 125 is complexly multiplied by the distortion compensation coefficient from the LUT 124. The resultant signal is then output. The signal is then subjected, by the D/A converter 131, to a process of converting the digital signal into an analog signal and, by the orthogonal modulator 132, to a process of orthogonally modulating the signal and then converting the orthogonally modulated signal into a radio frequency signal. The signal is then amplified by the power amplifier 133, and the resulting high-frequency transmission signal is transmitted through the antenna 135.

The nonlinear distortion characteristic of the power amplifier 133 is compensated for by the distortion compensation coefficient from the LUT 124 by which the OFDM signal is complexly multiplied. However, the nonlinear distortion characteristic of the power amplifier 133 is known to be varied depending on the environment in which the apparatus is installed, such as temperature. Thus, for distortion compensation for a change in environment, the signal output by the power amplifier 133 is fed back to update the distortion compensation coefficient stored in the LUT 124. Specifically, a part of the signal amplified by the power amplifier 133 is input to the orthogonal demodulator 137 via the directional coupler 134. The orthogonal demodulator 137 converts this radio frequency signal into a signal of the original baseband frequency band and further demodulates the signal. The A/D converter 138 then converts the signal into a digital signal. The subtractor 123 then subtracts the digital signal from the corresponding signal from the delay circuit 122. An output of the subtractor 123 allows detection only of the nonlinear distortion component of an actual output signal from the power amplifier 133. That is, the LUT 124 may update the distortion compensation coefficient using the distortion component from the subtractor 123. The LUT 124 updates the distortion compensation coefficient so as to suppress the detected distortion component.

As a technique related to the above-mentioned transmission apparatus, an OFDM signal transmission apparatus is suggested which avoids the adverse effect of the nonlinear distortion caused by the transmission power amplifier, by performing mapping control such that power for each OFDM symbol is prevented from exceeding a reference value and controlling the amplitude of a carrier modulation signal or the amplitude subjected to IFFT to allow the power amplifier to operate within the range of a linear region.

And as another technique, a nonlinear phase distortion compensation apparatus is suggested which stores compensation information corresponding to pre-divided regions of a dynamic range of output power, in a plurality of storage regions depending on the output power from the power amplifier, so that phase control is performed by selecting one of the plurality of storage regions in association with the output power.

SUMMARY

According to an aspect of the embodiments, a transmission apparatus includes a pseudo data addition section configured to add pseudo data into input transmission data for a free subcarrier of a radio frequency, an OFDM modulator subjecting the transmission data added with the pseudo data to OFDM modulation, a power amplifier amplifying power of a transmission signal of the radio frequency, the transmission signal based on an OFDM signal subjected to the OFDM modulation, an antenna radiating the amplified transmission signal by using the radio frequency, and a distortion compen-sation circuit compensating for a distortion characteristic of the power amplifier by correcting the OFDM signal with a distortion compensation coefficient accumulated corresponding to the power value of the OFDM signal and outputting the corrected signal for the power amplifier, and the distortion compensation circuit monitoring the output of the power amplifier to update the distortion compensation coefficient.

According to another aspect of the embodiments, a transmission method includes the step of adding pseudo data into input transmission data for a free subcarrier of a radio frequency, subjecting the transmission data added with the pseudo data to OFDM modulation, amplifying power of a transmission signal of the radio frequency by using a power amplifier, the transmission signal based on an OFDM signal subjected to the OFDM modulation, radiating the amplified transmission signal by using the radio frequency, compensating for a distortion characteristic of the power amplifier by correcting the OFDM signal with a distortion compensation coefficient accumulated corresponding to the power value of the OFDM signal to output the corrected OFDM signal for the power amplifier, and monitoring the output of the power amplifier to update the distortion compensation coefficient.

Additional objects and advantages of the embodiments will be set forth in part in the description which follows, and in part will be obvious from the description, or may be learned by practice of the embodiments. The object and advantages of the embodiments will be realized and attained by means of the elements and combinations particularly pointed out in the appended claims.

It is to be understood that both the foregoing summary description and the following detailed description are exemplary and explanatory and are not restrictive of the embodiment, as claimed.

BRIEF DESCRIPTION OF DRAWINGS

Embodiments are illustrated by way of example and not limited by the following figures.

FIGS. 5A-5D illustrate operation of the OFDM signal distortion-compensated and amplified transmission apparatus according to the first embodiment;

FIGS. 11A-11C illustrate operation of an OFDM signal distortion-compensated and amplified transmission apparatus according to the third embodiment; and FIGS. 12A and 12B illustrate an operation flowchart of the pseudo data addition section according to the third embodiment.

DESCRIPTION OF EMBODIMENTS

As part of inventing certain embodiments of the present invention, observations were made regarding there being problems with the related methods previously referred to in the Background.

Figure 1:
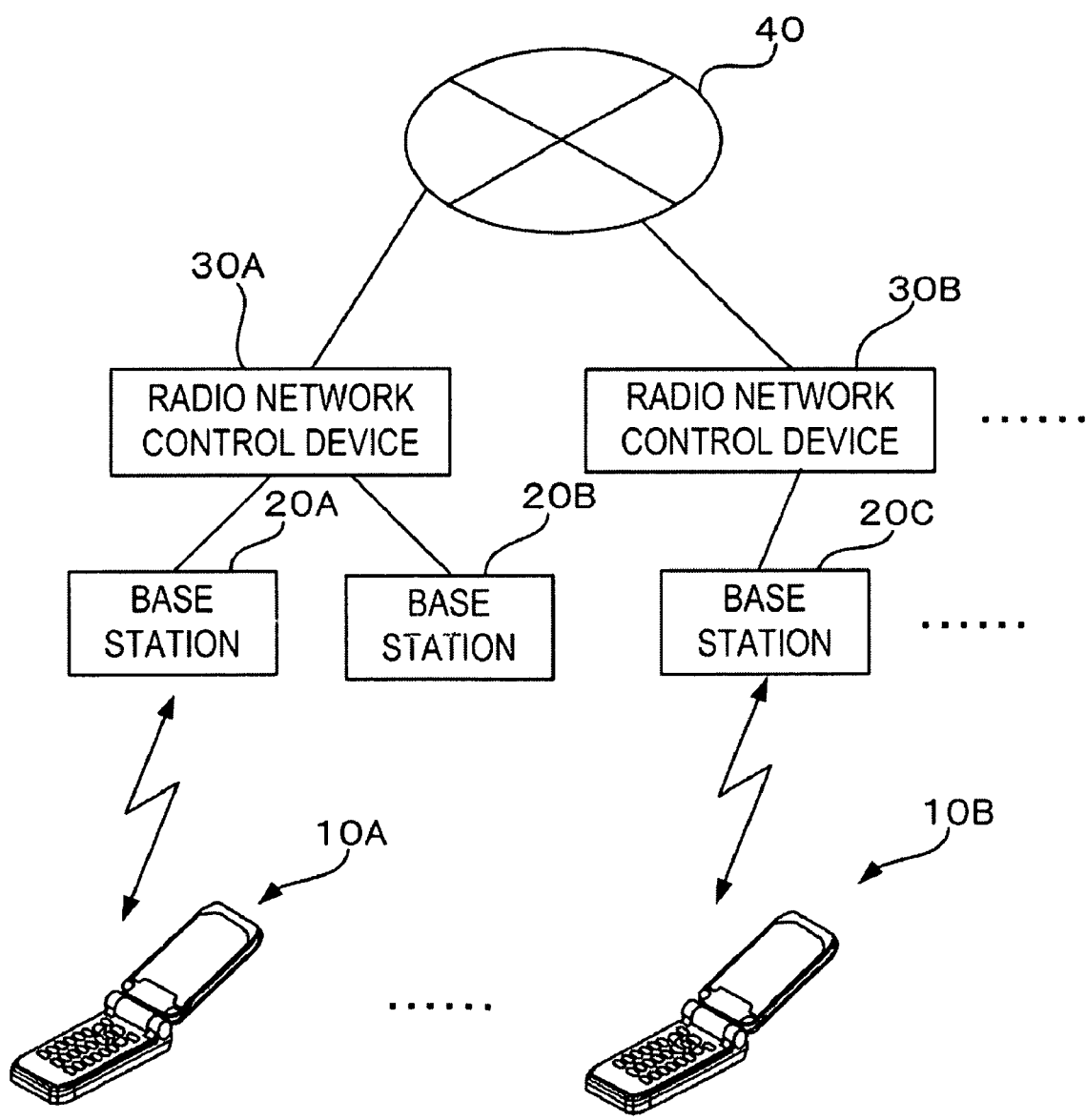
FIG. 1 illustrates an entire radio communication network.
Figure 2:
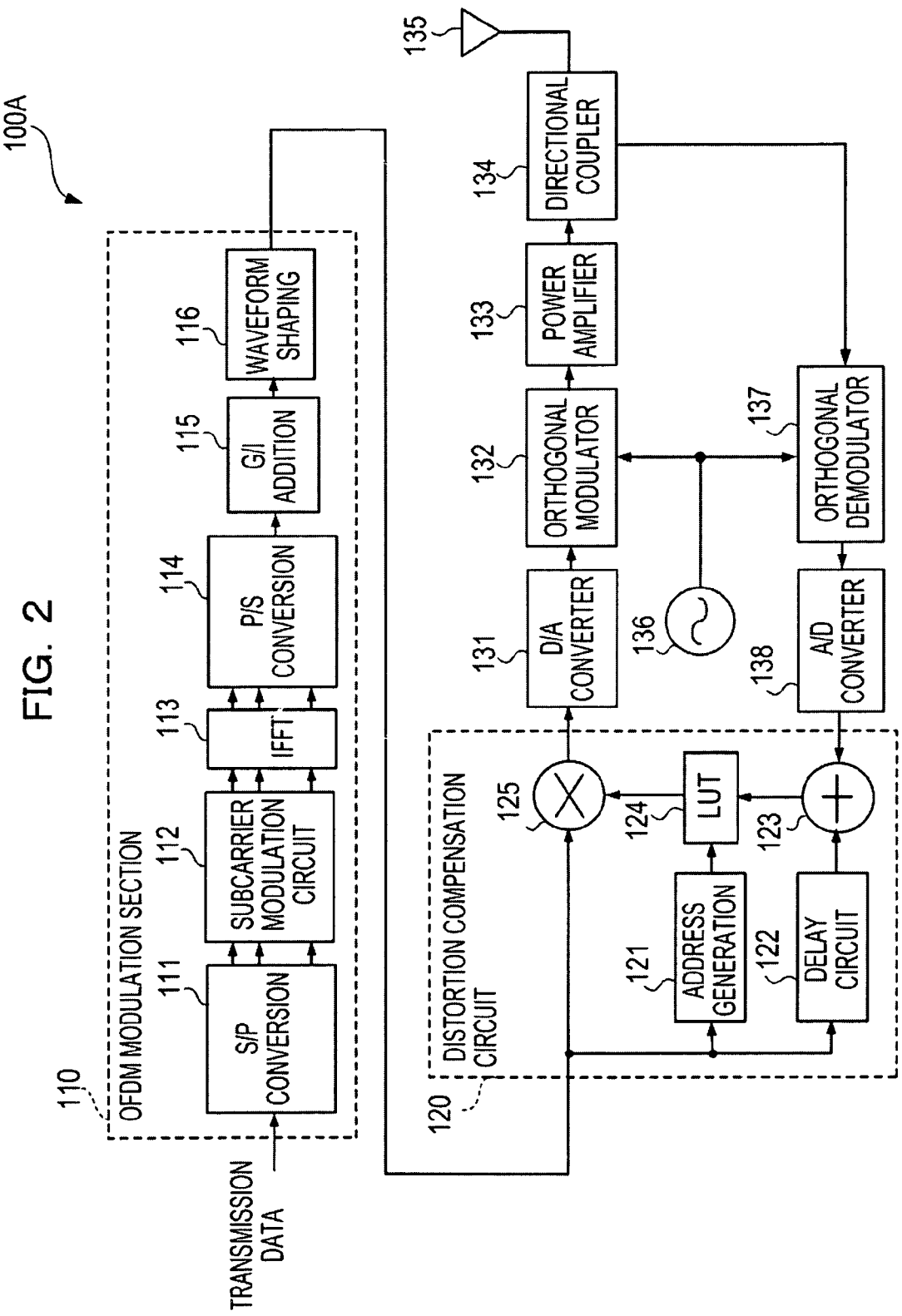
FIG. 2 illustrates a configuration of a conventional OFDM signal distortion-compensated and amplified transmission apparatus.

For example, in the OFDM signal distortion-compensated and amplified transmission apparatus 100A illustrated in FIG. 2, the distortion compensation circuit 120 performs distortion compensation by controlling so as to minimize the difference between the reference signal and the feedback signal. However, for the distortion compensation coefficient required for the distortion compensation, initial values are stored which are obtained by carrying out (rated) training of a predetermined pattern in a factory within a limited test time during the manufacture of the apparatus. Thus, meticulously storing distortion compensation coefficient corresponding to input levels is difficult.

Consequently, if, during operation, an unrated signal of a level corresponding to a region for which training is insufficient is unexpectedly input to the power amplifier, immediately outputting the optimum distortion compensation coefficient is difficult. Accordingly, disadvantageously, a long time is required to allow the distortion compensation coefficient to converge in connection with updating of a table based on the distortion. During that time, the distortion characteristic may be degraded.

In particular, in such a case where many calls (connections between a base station and mobile stations) are transiently made when operating in a radio network, a transmission power value increases rapidly. In such a case, in order to maintain communication quality, there is an increased necessity to reduce the time required to convergently update the table to keep radio characteristics within standards.

The distortion-compensated and amplified transmission apparatus is also affected by temporal changes in the power amplifier and a variation in a distortion characteristic resulting from a variation in temperature. In a case where there are always many calls, a table in which distortion compensation coefficients in high power output are stored has been prepared, thus reducing the amount of error. However, during normal actual operation in which high power is relatively infrequently provided, the amount of error in the distortion compensation coefficient stored in the LUT 124 increases relatively. In contrast, for example, during training, tables for a low signal level, a medium signal level, and a high signal level may be meticulously created to reduce the time required to convergently update the tables. However, this increases the capacity of the LUT 124, the test time in the factory, and thus costs.

For example, with the technique described in Japanese Patent Laid-Open No. 2006-135417, data mismatch between the base station and another station to communicate may arise, depending on an applied system. Furthermore, the throughput of the system may decrease thereby preventing advantages of OFDM communication from being maximized.

Additionally, with the technique described in Japanese Patent Laid-Open No. 2002-232328, the sizes of memories and peripheral circuits may increase and thus the costs of the apparatus may increase. Furthermore, since the time required for training may with the technique increase, the test time during the manufacture of the apparatus may increase and thus the costs of the apparatus may increase.

Hereinafter, examples of embodiments of the disclosed transmission apparatus and transmission method will be described with reference to the drawings.

<The First Embodiment>

Figure 3:
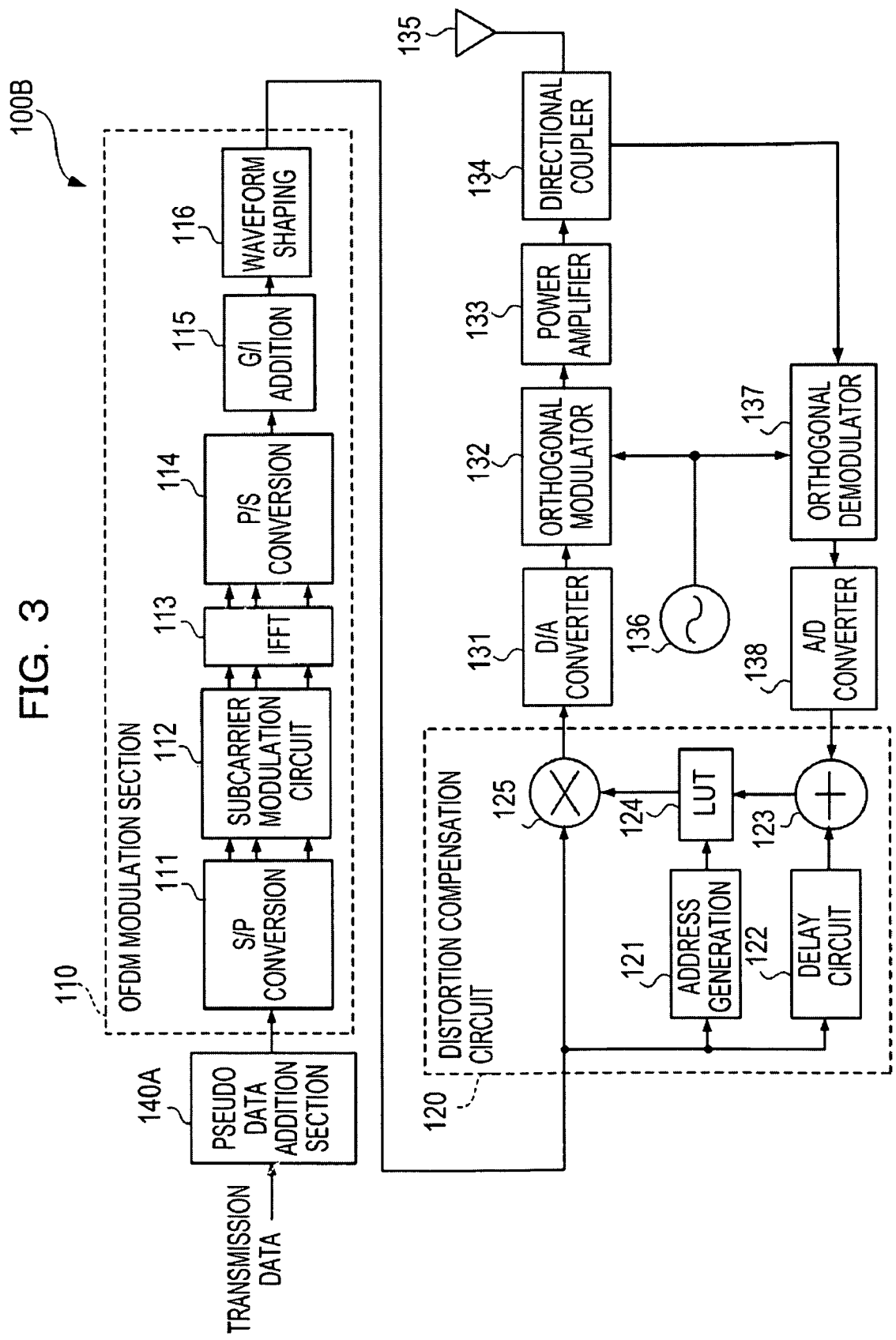
FIG. 3 is a block diagram illustrating an OFDM signal distortion-compensated and amplified transmission apparatus according to a first embodiment.

FIG. 3 is a block diagram illustrating an OFDM signal distortion-compensated and amplified transmission apparatus according to a first embodiment.

A distortion-compensated and amplified transmission apparatus 100B according to a first embodiment illustrated in FIG. 3 has the same configuration as that of the conventional distortion-compensated and amplified transmission apparatus 100A illustrated in FIG. 2 except that a pseudo data addition section 140A is additionally provided in the preceding stage of an OFDM modulation section 110. Since the distortion-compensated and amplified transmission apparatus 100B is the same as the conventional distortion-compensated and amplified transmission apparatus 100A illustrated in FIG. 2 except for the addition of the pseudo data addition section 140A, duplicate descriptions are omitted and the pseudo data addition section 140A will be described below.

Figure 4:
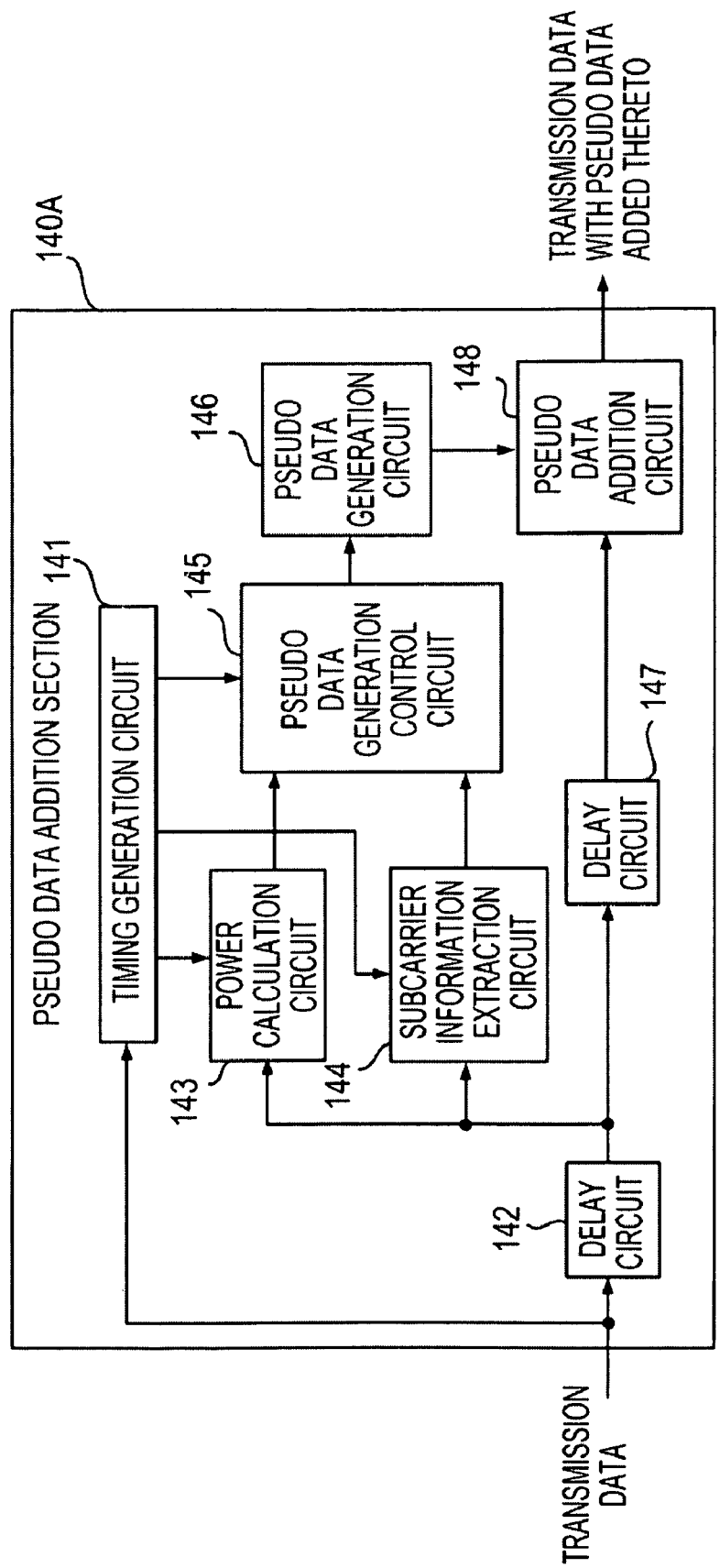
FIG. 4 is a block diagram illustrating a configuration of a pseudo data addition section illustrated by one block in FIG. 3.

FIG. 4 is a block diagram illustrating a configuration of the pseudo data addition section 140A, illustrated by one block in FIG. 3.

The pseudo data addition section 140A illustrated in FIG. 4 is composed of a timing generation circuit 141, a first delay circuit 142, a power calculation circuit 143, a subcarrier information extraction circuit 144, a pseudo data generation control circuit 145, a pseudo data generation circuit 146, a second delay circuit 147, and a pseudo data addition circuit 148.

The timing generation circuit 141 generates timing for detecting a frame head of the transmission data to perform the process for generating pseudo data. The first delay circuit 142 delays the transmission data by the time required to detect the frame head to adjust the timing. The power calculation circuit 143 calculates a power value for each symbol interval. The subcarrier information extraction circuit 144 extracts subcarrier assignment information for each symbol from FCH/DL-MAP (described below). The pseudo data generation control circuit 145 controls a pseudo data generation process according to the power value for each symbol and the subcarrier information. The pseudo data generation circuit 146 generates pseudo data to be inserted into the transmission data, for each symbol. The second delay circuit 147 delays the transmission data that is an output of the first delay circuit 142, by the amount of time for the process carried out until the pseudo data is generated. The pseudo data addition circuit 148 adds the pseudo data generated by the pseudo data generation circuit 146 to the transmission data that is an output of the second delay circuit 147.

Description of effects of the pseudo data addition section 140A illustrated in FIG. 4 will be given below together with description of a flowchart in FIG. 6.

FIGS. 5A-5D illustrate operation of the OFDM signal distortion-compensated and amplified transmission apparatus according to the first embodiment.

FIG. 5A illustrates a configuration of frames that are units of transmission and reception. Frame (K−1), Frame (K), Frame (K+1), and Frame (K+2) are arranged in this order.

FIG. 5B is a diagram illustrating a configuration of symbols. One frame (in this case, Frame (K)) includes symbols 0 to N making up a down link transmitted from a base station to a mobile station, a guard interval called TTG and allowing the down link to be switched to an up link transmitted from the mobile station to the base station, symbols (N+1) to (N+M) making up the up link, and a guard interval called RTG is placed between symbol (N+M) and the next frame (K+1) to allow the up link to be switched to the down link.

Here, focus is put on transmission from the base station to the mobile station, and the down link will be described in further detail.

Symbol 0 in the down link is called a preamble symbol allowing the mobile station to synchronize. Symbols 1 and 2 contain FCH/DL-MAP data, and in symbol 3 and subsequent symbols, user data is transmitted.

FCH (Frame Control Data) in the FCH/DL-MAP data is control information, and DL-MAP in the FCH/DL-MAP data is subcarrier map information utilized for each of symbol 3 and the subsequent symbols. The subcarrier will be described later.

FIG. 5C illustrates a transmission level in each symbol in the down link. Symbol 0, which is the preamble symbol, and symbols 1 and 2, in which the control information and the like are stored, are at a predetermined transmission level. However, in symbol 3 and the subsequent symbols, the transmission level decreases according to usage of the subcarrier in each symbol as illustrated by a solid line in FIG. 5C.

FIG. 5D illustrates the subcarrier and pseudo data.

A certain frequency band is utilized to transmit transmission data. When the frequency band utilized is split into a large number of smaller frequency bands, each of the resulting frequency bands is called a subcarrier. For specific data transmission, not all the subcarriers within the frequency band are utilized. There exist certain subcarrier regions that are not utilized depending on such as the current amount of data transmitted. Information indicating which subcarrier is utilized or not together with the symbol and region thereof is recorded in the DL-MAP, described above.

The graph (D1) of FIG. 5D schematically illustrates subcarriers utilized and subcarriers not utilized for symbol 3 (see FIG. 5B) in Frame (K) (see FIG. 5A).

As illustrated in the graph (D2) of FIG. 5D, the pseudo data addition section 140 illustrated in FIGS. 3 and 4 adds pseudo data to empty subcarriers so as to fill the empty region between the subcarriers utilized. Thus, the transmission power level may be maintained constant as illustrated by a dashed line in FIG. 5C.

Figure 6:
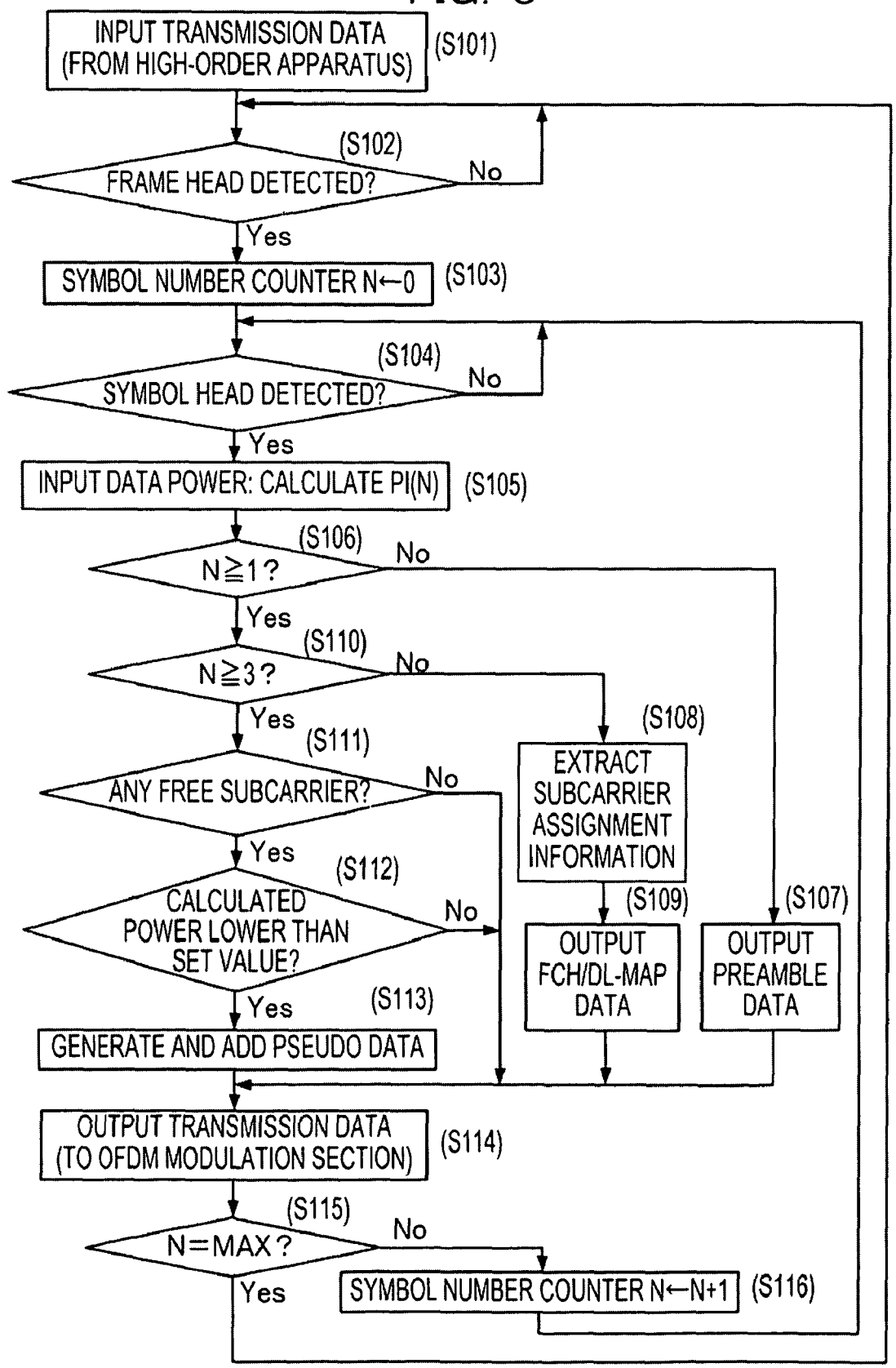
FIG. 6 illustrates an operation flowchart of the pseudo data addition section according to the first embodiment.

FIG. 6 is an operation flowchart of the pseudo data addition section according to the first embodiment.

The operation of the OFDM signal distortion-compensated and amplified transmission apparatus according to the first embodiment will be described with reference to FIGS. 3, 4, 5A-5D, and 6.

The pseudo data addition section 140A illustrated in FIG. 4 operates according to the flowchart illustrated in FIG. 6. First, transmission data input by a high-order apparatus is input to the pseudo data addition section 140A (step S101). Then, the pseudo data addition section 140A detects the frame head according to timing for a frame head detection process provided by the timing generation circuit 141 (step S102). After detecting the frame head, the pseudo data addition section 140A clears a transmission symbol number counter (step S103). The pseudo data addition section 140A then carries out a symbol head detection process to detect a symbol head (step S104). After the symbol head is detected, the power calculation circuit 143 calculates transmission power for the symbol interval according to a timing signal generated by the timing generation circuit 141 (step S105). The transmission data input to the power calculation circuit 143 is delayed by the first delay circuit 142 by the time required to generate the timing signal that is an output of the timing generation circuit 141.

If the transmission data is the head symbol of the frame (symbol number counter=0), the pseudo data addition section 140A determines that the transmission data is the preamble symbol. Since the preamble symbol is a signal that allows the mobile station to synchronize, the pseudo data addition section 140A does not add the pseudo data and outputs the transmission data as it is (steps S106, S107, and S114).

If the transmission data is the first or second symbol (symbol number counter=1 or 2), the pseudo data addition section 140A allows the subcarrier information extraction circuit 144 to extracts the subcarrier assignment status of each of the third and subsequent symbols. The pseudo data addition section 140A determines the first or second symbol to be "FCH/DL-MAP data" and directly outputs the symbol without adding the pseudo data to the symbol (steps S110, S108, S109, and S114).

If the transmission data is the third or subsequent symbols, the pseudo data addition section 140A allows the pseudo data generation control circuit 145 to determine whether or not any subcarrier is free based on the subcarrier assignment status extracted by the subcarrier information extraction circuit 144. If no subcarrier is free, the pseudo data addition section 140A directly outputs the transmission data. If any subcarrier is free, the pseudo data addition section 140A determines whether or not the calculation result provided by the power calculation circuit 143 is smaller than a preset value (see FIG. 5C). If the calculation result is equal to or larger than the preset value, the pseudo data addition section 140A directly outputs the transmission data. If the calculation result is smaller than the preset value, the pseudo data addition section 140A allows the pseudo data generation circuit 146 to generate the pseudo data so as to set the transmission symbol power equal to the preset value. The pseudo data addition section 140A then allows the pseudo data addition circuit 148 to add the pseudo data to the transmission signal and then outputs the resulting signal (steps S110, S111, S112, S113, and S114). The transmission data output in step S114 is delayed by the second delay circuit 147 by time required by the power calculation circuit 143 to calculate the power for the symbol interval.

After the transmission data is output in step S114, the pseudo data addition section 140A determines whether or not the symbol number counter has reached the transmission symbol number (maximum value) of the frame (step S115). If the symbol number counter has not reached the maximum value, the pseudo data addition section 140A increments the symbol number counter by one (step S116). The pseudo data addition section 140A then returns to step S104 to carry out the transmission symbol head detection process to repeat the pseudo data addition process for the frame. If the symbol number counter has reached the maximum value, the pseudo data addition section 140A returns to step S102 to carry out the next frame head detection process to start the pseudo data addition process for the next frame.

As described above, for each of the transmission symbols in one frame, the pseudo data addition section 140A outputs the transmission data at the transmission power of the preset value. Thus, in FIG. 2, the transmission data in which the transmission level of each symbol is constant is input to the OFDM modulation section 110.

The pseudo data is a signal for updating the distortion compensation coefficient. When the pseudo data is a signal with no particular destination, that is, a signal different from that destined for a mobile station by the high-order apparatus (for example, a pseudo random pattern signal), the mobile station may be prevented from being erroneously connected.

As described above, according to the first embodiment, the distortion compensation circuit 120 updates the distortion compensation coefficient for the transmission data set to the given level by the pseudo data addition process carried out by the pseudo data addition section 140A. Thus, even if the transmission level of the transmission data input by the high-order apparatus varies, a variation in the distortion component provided by the power amplifier 133 is minimized. Therefore, degradation of the distortion compensation characteristic is reduced or prevented, thus allowing the distortion compensation operation to be convergently stabilized.

Here, the pseudo data addition section may calculate the power of the input transmission data, and when the calculated power is less than a first set value, the pseudo data addition section may add the pseudo data to the free subcarrier.

This enables avoidance of a possible rapid change in the input level to the power amplifier and the like, allowing the input level to be maintained almost constant.

That is, the pseudo data addition section 140A is provided to add the pseudo data to the free subcarrier in the transmission data to avoid possible rapid level changes of the input to the power amplifier 133. Thus, the OFDM distortion-compensated and amplified transmission apparatus according to the first embodiment enables the distortion compensation circuit 120 to achieve accurate distortion compensation.

<The Second Embodiment>

A block configuration of an OFDM distortion-compensated and amplified transmission apparatus according to a second embodiment described below corresponds to the OFDM distortion-compensated and amplified transmission apparatus 100B according to the first embodiment illustrated in FIG. 3 in which the pseudo data addition section 140A is replaced with a pseudo data addition section 140B illustrated below. Thus, the illustration and description of the OFDM distortion-compensated and amplified transmission apparatus according to the second embodiment as a whole are omitted.

Figure 7:
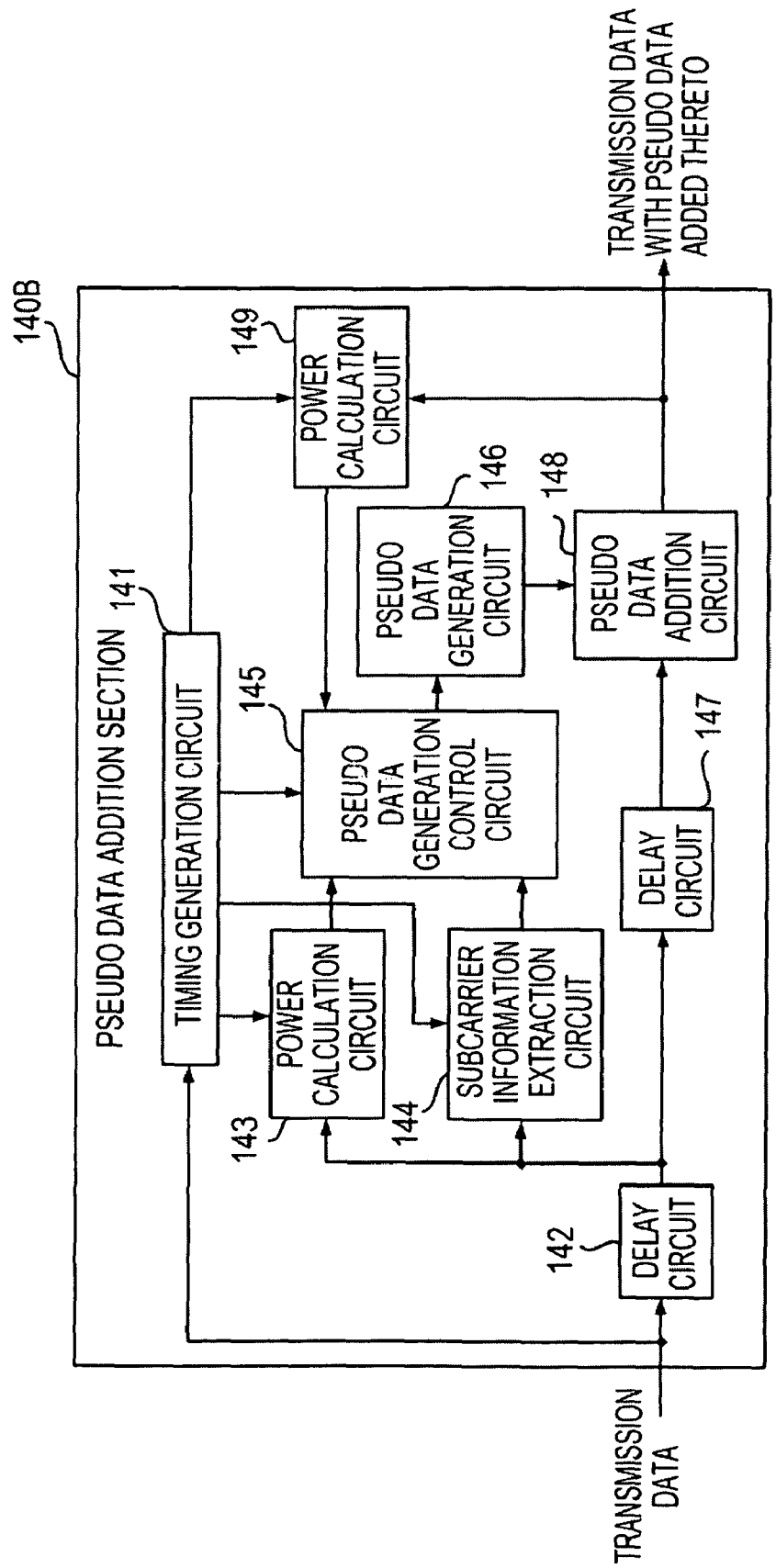
FIG. 7 is a block diagram illustrating a pseudo data addition section according to a second embodiment.

FIG. 7 is a block diagram illustrating the pseudo data addition section according to the second embodiment.

The pseudo data addition section 140B illustrated in FIG. 7 corresponds to the pseudo data addition section 140A illustrated in FIG. 4 and which further includes a second power calculation circuit 149 calculating the power value of the transmission data which has been subjected to the pseudo data addition process and which is an output of the pseudo data addition circuit 148, the second power calculation circuit 149 notifying the pseudo data generation control circuit 145 of the power value. The effects of the second power calculation circuit 149 will be described later.

FIGS. 8A-8C illustrate operation of the OFDM distortion-compensated and amplified transmission apparatus according to the second embodiment.

Like FIGS. 5A and 5B, FIGS. 8A and 8B illustrate a configuration of frames and a configuration of symbols, respectively.

FIG. 8C illustrates changes in transmission power level before and after addition of pseudo data.

Here, a transmission power level P(MAX)–X that is lower by X than a transmission power level P(MAX) for symbols 0, 1, and 2 is defined as a first set value. Pseudo data is added so that for any symbol, the transmission power level is equal to or higher than the first set value. Moreover, the pseudo data is added so that a difference ΔP between a transmission power level P(N−1) for the preceding symbol and a transmission power level P(N) for the current symbol does not exceed a second set value α.

In the example illustrated in FIG. 5C, for symbol 3, the transmission power level is equal to or larger than the first set value P(MAX)–X, and the difference ΔP between the transmission power level for the preceding symbol 2 and the transmission power level for symbol 3 is equal to or smaller than the second set value α. Thus, to symbol 3, no pseudo data is added. For symbol 5, ΔP>α, and the pseudo data is added until the transmission power level becomes ΔP≦α. For symbols 6 and 7, since ΔP is smaller than P(MAX)–X, the pseudo data is added until the transmission power level reaches the first set value. This also applies to the description below.

Figure 9:
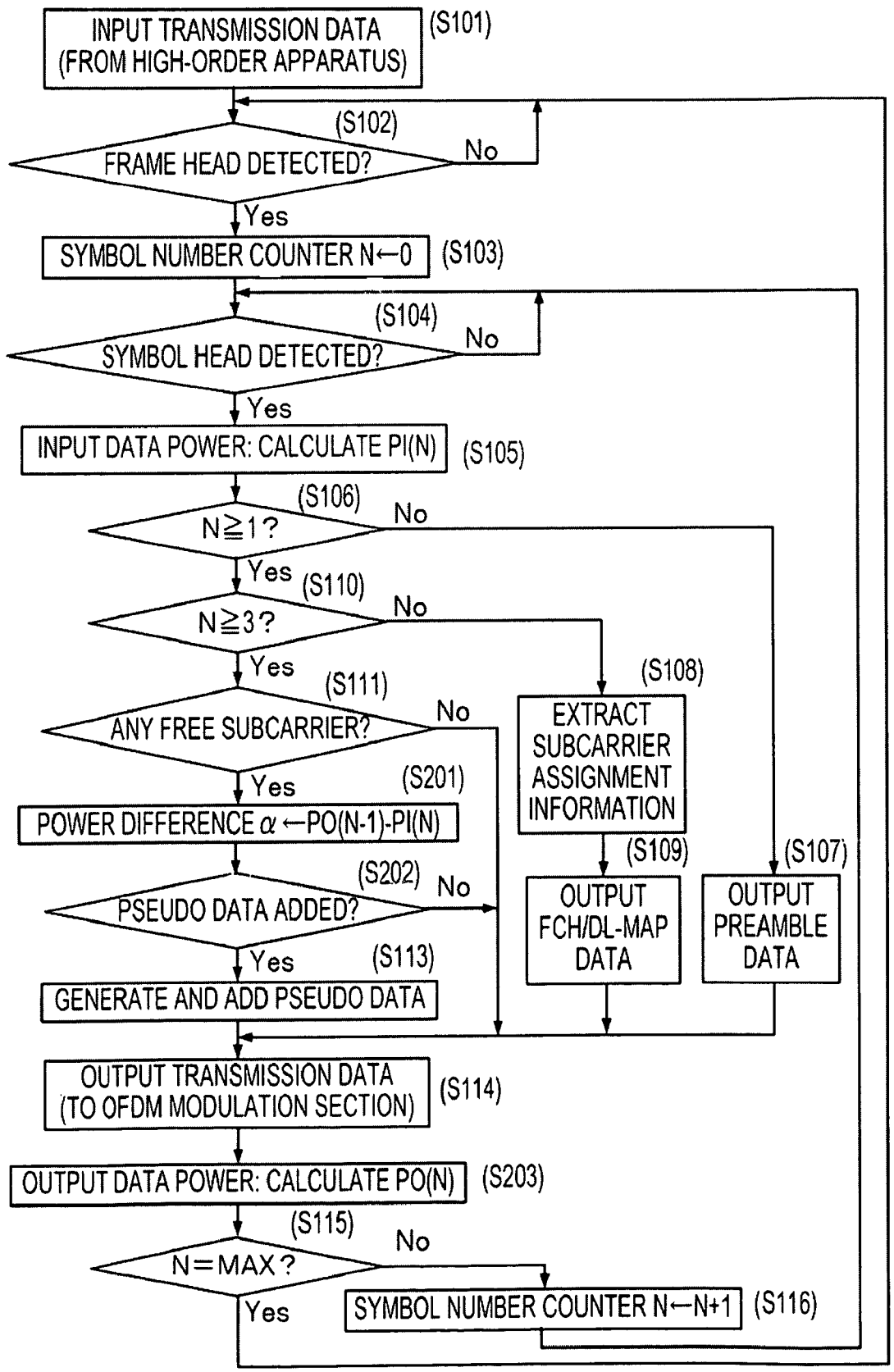
FIG. 9 illustrates an operation flowchart of the pseudo data addition section according to the second embodiment.

FIG. 9 is an operation flowchart of the pseudo data addition section 140B according to the second embodiment.

The flowchart in FIG. 9 is different from the flowchart of the first embodiment illustrated in FIG. 6 in that steps 201, 202, and 203 are added. This difference will be described below with reference to FIGS. 7, 8, and 9.

A part of an output of the pseudo data addition section 140B illustrated in FIG. 7 is input to the second power calculation circuit 149. The second power calculation circuit 149 calculates a transmission power value PO(N), which is then held by the pseudo data generation control circuit 145 (step S203 in FIG. 9).

If the transmission data is the fourth or subsequent symbol, the pseudo data addition section 140B allows the pseudo data generation control circuit 145 to determine whether or not any subcarrier is free, based on the subcarrier assignment status extracted by the subcarrier information extraction circuit 144. If no subcarrier is free, the pseudo data addition section 140B outputs the transmission data as it is. If any subcarrier is free, the pseudo data addition section 140B calculates the power difference α between the transmission power calculation result PO(N−1) for the preceding symbol and the transmission power calculation result PI(N) for the current symbol (step S201). The pseudo data addition section 140B then determines whether or not the power difference α is equal to or larger than a set value. If the power difference α is smaller than the set value and the power calculation result PI(N) is equal to or larger than the preset P(MAX)–X (X may be set to any value), the pseudo data addition section 140B outputs the transmission data as it is (step S202; No). If the power difference α is equal to or larger than the set value or the power calculation result PI(N) is smaller than the preset P(MAX)–X, the pseudo data addition section 140B allows the pseudo data generation circuit 146 to generate the pseudo data so that the transmission symbol power is equal to or higher than the preset ((P(MAX)–X)) and the transmission power value after addition of the pseudo data is |PO(N)–PO(N−1)|≦α. The pseudo data addition section 140B allows the pseudo data addition circuit 148 to add the pseudo data to the transmission data and then outputs the resulting transmission data (step S202; Yes).

Furthermore, as described above, as a part of an output of the pseudo data addition section 140B, the second power calculation circuit 149 calculates the transmission power value PO(N), which is then held by the pseudo data generation control circuit 145 (step S203).

Figure 8:
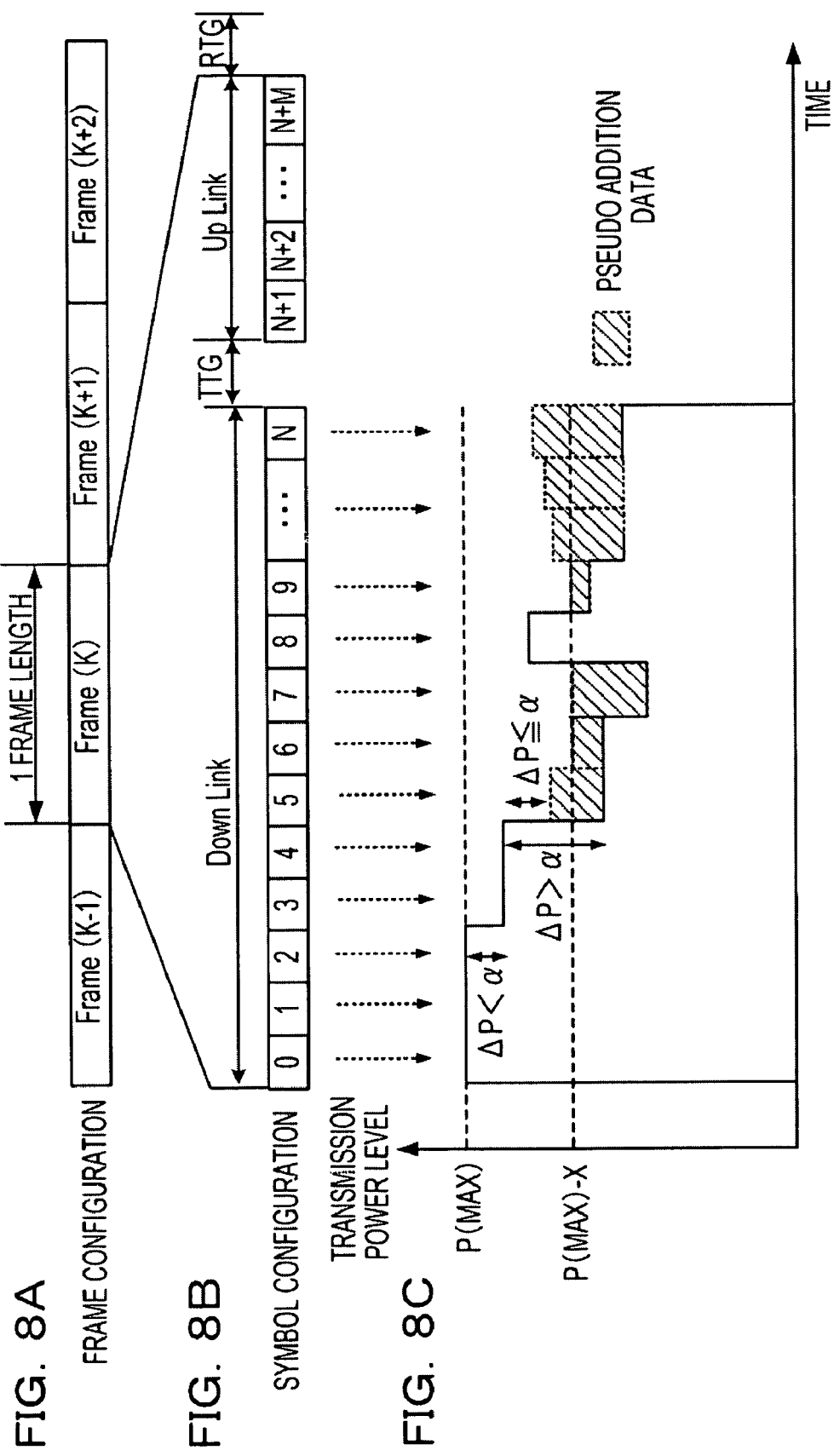
FIGS. 8A-8C illustrate operation of an OFDM signal distortion-compensated and amplified transmission apparatus according to the second embodiment.

Thus, in the second embodiment illustrated in FIGS. 7 to 9, for each of the transmission symbols in one frame, the pseudo data addition section 140B outputs such transmission data so that the transmission power of each of the transmission symbols in the frame varies between P(MAX) and (P(MAX)–X) and the transmission power may be prevented from varying rapidly between the symbols.

As is the case with the first embodiment, the pseudo data is a signal for updating the distortion compensation coefficient. When the pseudo data is a signal with no particular destination, that is, a signal different from that destined for the mobile station by the high-order apparatus (for example, a pseudo random pattern signal), the mobile station may be prevented from being erroneously connected.

As described above, according to the second embodiment, the distortion compensation circuit 110 updates the distortion compensation coefficient for the transmission data varying gradually within the constant variation range associated with the pseudo data addition process carried out by the pseudo data addition section 140B. Thus, even if the transmission level of the transmission data input by the high-order apparatus varies, a variation in the distortion component provided by the power amplifier 133 is minimized. Therefore, the distortion compensation characteristic may be prevented from being degraded, thus allowing the distortion compensation operation to be convergently stabilized.

As exemplified in the second embodiment, the pseudo data addition section may calculate and store the power of the input transmission data, and when the power difference between the last calculated power and the current calculated power is equal to or larger than the second set value, add the pseudo data to a free subcarrier.

In this case, the level of the input to the power amplifier varies gradually. The distortion compensation circuit may thus update the distortion compensation coefficient in conjunction with the variation in input level. Also in this case, accurate distortion compensation may be achieved.

<The Third Embodiment>

A block configuration of an OFDM distortion-compensated and amplified transmission apparatus according to a third embodiment described below corresponds to the OFDM distortion-compensated and amplified transmission apparatus 100B according to the first embodiment illustrated in FIG. 3 in which the pseudo data addition section 140A is replaced with a pseudo data addition section 140C illustrated below. Thus, as is the case with the second embodiment, the illustration and description of the OFDM distortion-compensated and amplified transmission apparatus according to the third embodiment as a whole are omitted.

Figure 10:
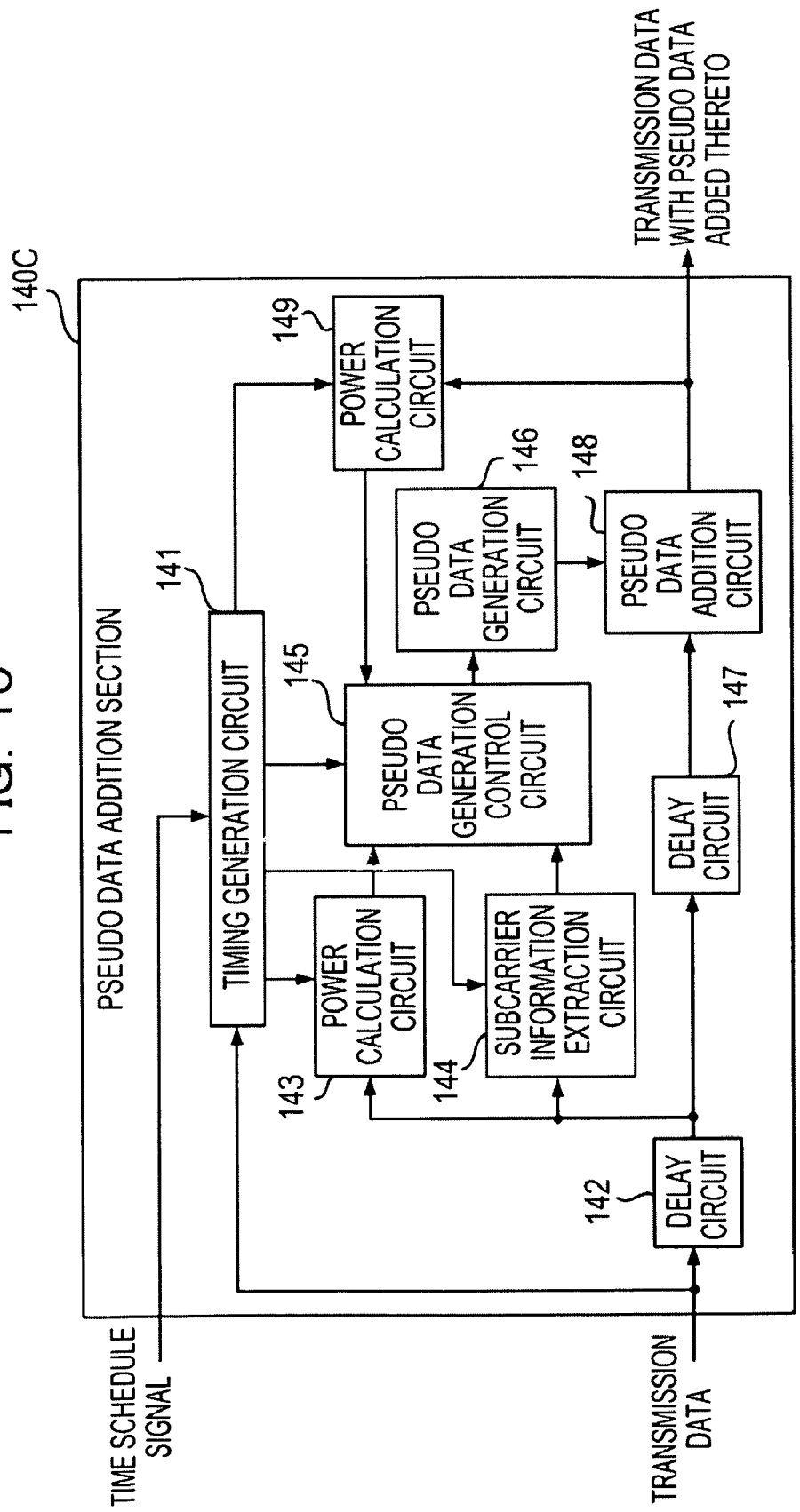
FIG. 10 is a block diagram illustrating a pseudo data addition section according to a third embodiment.

FIG. 10 is a block diagram illustrating the pseudo data addition section according to the third embodiment.

The pseudo data addition section 140C illustrated in FIG. 10 is different from the pseudo data addition section 140B according to the second embodiment illustrated in FIG. 7 in that a time schedule signal is input to the timing generation circuit 141.

FIGS. 11A-11C illustrate operation of the OFDM distortion-compensated and amplified transmission apparatus according to the third embodiment. Here, FIGS. 11A-11C illustrate an example of a configuration of frames for a system to which OFDM based on TDD communication (Time Division Duplex) is applied.

Such a time schedule signal as illustrated in FIG. 11A is input to the timing generation circuit 141 in the pseudo data addition section 140C according to the third embodiment illustrated in FIG. 10. According to the time schedule signal, the timing generation circuit 141 determines whether or not to carry out the pseudo data addition process on frames arranged as illustrated in FIG. 11B. The timing generation circuit 141 then notifies the pseudo data generation control circuit 145 of the determination result.

FIG. 11C illustrates a temporal transition in transmission power level. FIG. 11C depicts an image of the transmission power level of the frames in connection with operation of the pseudo data addition section 140C. For example, in a "mobile station increase expected interval" which is where the number of mobile stations is expected to increase, the transmission power between the adjacent frames rises to the maximum transmission power at increments of $\Delta P(M)$. In a "mobile station decrease expected interval" which is where the number of mobile stations is expected to decrease, the transmission power between the adjacent frames lowers to the lower limit of a maximum power threshold in decrements $\Delta f$ $AP(M)$.

Figure 12B:
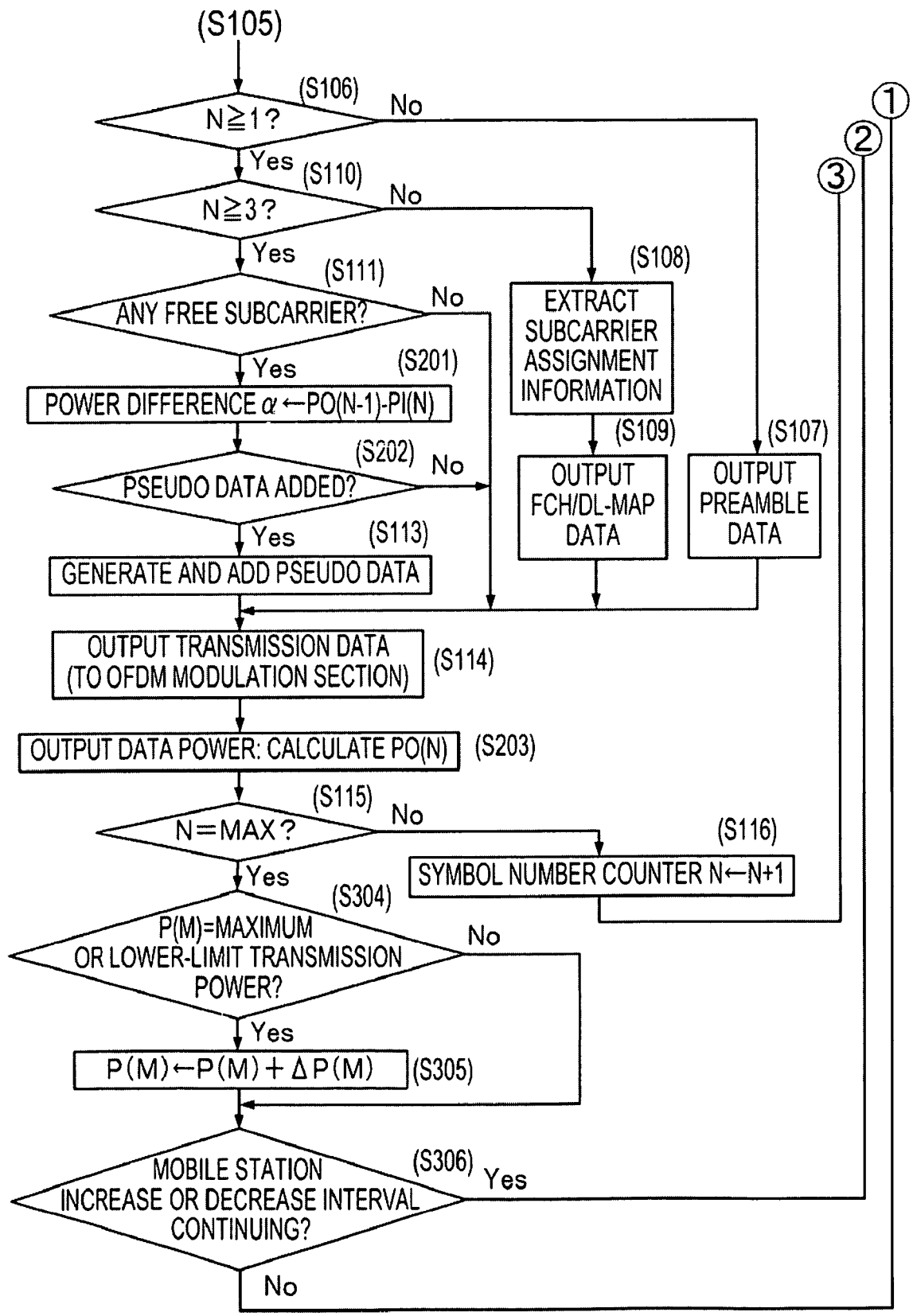

FIGS. 12A and 12B illustrate an operation flowchart of the pseudo data addition section according to the third embodiment.

A difference between FIGS. 12A and 12B, and FIG. 9 which is the flowchart of the second embodiment lies in steps S301 to S303 and S304 to S306. The difference will be described below.

The pseudo data addition section 140C illustrated in FIG. 10 operates according to the flowchart illustrated in FIGS. 12A and 12B. First, the transmission data input by the high-order apparatus is input to the pseudo data addition section 140C (step S101). Then, the pseudo data addition section 140C allows the timing generation circuit 141 to determine whether the current interval is the mobile station increase expected interval or the mobile station decrease expected interval (step S301). If the current interval is neither the mobile station increase expected interval nor the mobile station decrease expected interval, the pseudo data addition section 140C stops the pseudo data addition process and outputs the transmission data (step S302). The pseudo data addition section 140C then repeats steps S301 and S302 until the pseudo data addition section 140C determines that the current interval is the mobile station increase expected interval or the mobile station decrease expected interval. On the other hand, on determining that the current interval is the mobile station increase expected interval or the mobile station decrease expected interval, the pseudo data addition section 140C sets an initial value and an increment value $\Delta P(M)$ for the maximum power threshold $P(M)$ (step S303). In step S102 and subsequent steps, the pseudo data addition section 140C carries out processing similar to that in the first and second embodiments.

Upon determining in step S115 that the number of transmission symbols N has reached the maximum value, the pseudo data addition section 140C determines, for the mobile station increase expected interval, whether or not the maximum power threshold $P(M)$ is equal to the maximum transmission power of the apparatus (step S304). If the maximum power threshold $P(M)$ is not equal to the maximum transmission power, the pseudo data addition section 140C adds $\Delta P(M)$ to the maximum power threshold $P(M)$. If the maximum power threshold $P(M)$ is equal to the maximum transmission power, the pseudo data addition section 140C carries out nothing (steps S304 and S305). The pseudo data addition section 140C subsequently determines whether or not the mobile station increase expected interval still continues (step S306). If the mobile station increase expected interval still continues, the pseudo data addition section 140C returns to step S102 to carry out the next frame head detection process to start the pseudo data addition process for the next frame. If the mobile station increase expected interval is over, the pseudo data addition section 140C returns to step S301.

The case of the mobile station increase expected interval has been described. The pseudo data addition section 140C also carries out similar processing for the mobile station decrease expected interval. Thus, setting a negative increment value $\Delta P(M)$ for the maximum power threshold allows such transmission data to be output such that the transmission power between the adjacent frames decreases gradually from the maximum transmission power to the lower limit of the maximum power threshold $P(M)$.

As described above, in the mobile station increase or decrease expected interval, for each of the transmission symbols in one frame, the pseudo data addition section 140C outputs such transmission data such that the transmission power of each of the transmission symbols in the frame varies between the maximum power threshold P(M) and (P(M)−X) and the transmission power may be prevented from varying rapidly between the symbols. Moreover, while the mobile station increase or decrease expected interval is continuing, the pseudo data addition section 140C carries out the pseudo data addition process while increasing the maximum power threshold P(M) up to the maximum transmission power of the apparatus step by step. Thus, such transmission data is output such that the transmission power between the adjacent frames rises gradually to the maximum transmission power.

As is the case with the first and second embodiments, the pseudo data is a signal for updating the distortion compensation coefficient. By making the pseudo data being a signal with no particular destination, that is, a signal different from that destined for the mobile station from the high-order apparatus (for example, a pseudo random pattern signal), the mobile station may be prevented from being erroneously connected.

Thus, according to the third embodiment, the time schedule signal input from the high-order apparatus turns on and off the operation of the pseudo data addition section 140C. The distortion compensation circuit 120 updates the distortion compensation coefficient for the transmission data varying gradually within the constant variation range associated with the pseudo data addition process. Thus, even if the transmission level of the transmission data input from the high-order apparatus varies, a variation in the distortion component provided by the power amplifier 133 is minimized. Therefore, a degradation of the distortion compensation characteristic may be prevented, thus allowing the distortion compensation operation to be convergently stabilized. Furthermore, the maximum transmission power of the apparatus may be controlled, thus allowing the amplified transmission apparatus to efficiently consume power.

As exemplified in the third embodiment, the time schedule signal, indicating whether to permit or inhibit addition of the pseudo data, is input to the pseudo data addition section. Then, according to the time schedule signal, the pseudo data addition section adds the pseudo data to the input transmission signal only during the period in which the addition of the pseudo data is permitted.

The addition of the pseudo data raises the transmission power and acts to increase the power consumption. Thus, a useless increase in power may be inhibited by adding the pseudo data in a time zone in which the transmission power changes rapidly, for example, a time zone in which the number of mobile stations desiring to communicate increases rapidly (for example, at dawn) or a time zone in which the number of mobile stations desiring to communicate decreases rapidly (for example, time when most people go to bed), and stopping the addition of the pseudo data in the other time zones.

As described above, according to the embodiments, by controlling the insertion of the pseudo data into the subcarrier to which no transmission data is assigned, the capacity of memory used for the table of distortion compensation coefficients may be minimized. This also helps to prevent a possible increase in test time required to obtain initial values for the distortion compensation coefficient during the manufacture of the apparatus. Thus, even if in the input transmission data, the transmission power varies rapidly between the OFDM transmission symbols or between the transmission frames, the distortion compensation operation may be achieved without degrading the distortion compensation characteristic, by controlling the amount of variation in transmission power to the degree that the distortion compensation characteristic is not degraded. Moreover, the adverse effects of temporal changes in an analog circuit and a variation in the temperature thereof may be absorbed.

Furthermore, in the third embodiment, by controlling the start and stop of generation of the pseudo data according to the time schedule signal, the amount of variation in transmission power may be controlled to the degree that the distortion compensation characteristic is not degraded, depending on a statistically obtained connection status of the mobile station. Controlling the transmission power as described above is effective for reducing the power consumption while ensuring the distortion compensation characteristic.

As described above, the disclosed OFDM distortion-compensated and amplified transmission apparatus according to the present embodiments may quickly respond even to a rapid change in input signal power to accurately compensate for the distortion caused by the power amplifier.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

The invention claimed is:

1. A transmission apparatus comprising:
   a pseudo data addition section configured to add pseudo data into input transmission data comprised of at least a subcarrier of a radio frequency to fill an empty region in the input transmission data;
   an OFDM (Orthogonal Frequency Division Multiplexing) modulator subjecting the transmission data added with the pseudo data to OFDM modulation;
   a power amplifier amplifying power of a transmission signal of the radio frequency, the transmission signal based on an OFDM signal subjected to the OFDM modulation;
   an antenna radiating the amplified transmission signal by using the radio frequency; and
   a distortion compensation circuit compensating for a distortion characteristic of the power amplifier by correcting the OFDM signal with a distortion compensation coefficient accumulated corresponding to the power value of the OFDM signal and outputting the corrected signal for the power amplifier, and the distortion compensation circuit monitoring the output of the power amplifier to update the distortion compensation coefficient.

2. The transmission apparatus according to claim 1, further comprising:
   a D/A converter converting an OFDM signal subjected to the OFDM modulation into an analog transmission signal; and
   an orthogonal modulator orthogonally modulating the analog transmission signal, and converting the orthogonally modulated signal into the transmission signal of the radio frequency; and wherein
   the distortion compensation circuit outputting the corrected signal to the D/A converter.

3. The transmission apparatus according to claim 1, wherein the pseudo data addition section adds the pseudo data according to the power of the input transmission data.

4. The transmission apparatus according to claim 1, wherein the pseudo data addition section calculates the power of the input transmission data, and when the calculated power is lower than a first set value, adds the pseudo data into the input transmission data for a free subcarrier.

5. The transmission apparatus according to claim 1, wherein the pseudo data addition section calculates and stores the power of the input transmission data, and when a power difference between the last calculated power and the current calculated power is equal to or greater than a second set value, the pseudo data addition section adds the pseudo data into the input transmission data for a free subcarrier.

6. The transmission apparatus according to claim 1, wherein the pseudo data addition section inputs a time schedule signal indicating permission or inhibition of the addition of the pseudo data, and according to the time schedule signal, the pseudo data addition section adds the pseudo data to the input transmission signal only during a period in which the addition of the pseudo data is permitted.

7. The transmission apparatus according to claim 1, wherein the distortion compensation circuit updates the distortion compensation coefficient according to the pseudo data adding by the pseudo data addition section.

8. A transmission method comprising:
adding pseudo data into input transmission data comprised of at least a subcarrier of a radio frequency to fill an empty region in the input transmission data;
subjecting the transmission data added with the pseudo data to OFDM(Orthogonal Frequency Division Multiplexing) modulation;
amplifying power of a transmission signal of the radio frequency by using a power amplifier, the transmission signal based on an OFDM signal subjected to the OFDM modulation;
radiating the amplified transmission signal by using the radio frequency;
compensating for a distortion characteristic of the power amplifier by correcting the OFDM signal with a distortion compensation coefficient accumulated corresponding to the power value of the OFDM signal to output the corrected OFDM signal for the power amplifier; and
monitoring the output of the power amplifier to update the distortion compensation coefficient.

9. An OFDM(Orthogonal Frequency Division Multiplexing) modulation device comprising:
a pseudo data addition section configured to add pseudo data into input transmission data comprised of at least a subcarrier of a radio frequency to fill an empty region in the input transmission data;
an OFDM modulator subjecting the transmission data added with the pseudo data to OFDM modulation; and
a distortion compensation circuit compensating for a distortion characteristic of a power amplifier by correcting the OFDM signal with a distortion compensation coefficient accumulated corresponding to the power value of the OFDM signal and outputting the corrected signal for the power amplifier, and the distortion compensation circuit monitoring the output of the power amplifier to update the distortion compensation coefficient.

10. The device of claim 9 further comprising:
the power amplifier amplifying power of a transmission signal of the radio frequency from the distortion compensation circuit.

11. The device of claim 9, wherein the pseudo data addition section calculates the power of the input transmission data, and when the calculated power is lower than a first set value, adds the pseudo data into the input transmission data for a free subcarrier.

* * * * *